United States Patent [19]

Itoh et al.

[11] Patent Number: 6,001,431
[45] Date of Patent: Dec. 14, 1999

[54] PROCESS FOR FABRICATING A MAGNETIC RECORDING MEDIUM

[75] Inventors: Kenji Itoh; Shigenori Hayashi, both of Kanagawa, Japan

[73] Assignee: Semiconductor Energy Laboratory Co., Ltd., Kanagawa, Japan

[21] Appl. No.: 08/604,713

[22] Filed: Feb. 21, 1996

Related U.S. Application Data

[63] Continuation of application No. 08/173,961, Dec. 28, 1993, abandoned.

[30] Foreign Application Priority Data

| Dec. 28, 1992 | [JP] | Japan | ................................. 4-360193 |
| Dec. 28, 1992 | [JP] | Japan | ................................. 4-360194 |
| Dec. 24, 1993 | [JP] | Japan | ................................. 5-347647 |
| Dec. 24, 1993 | [JP] | Japan | ................................. 5-347648 |

[51] Int. Cl.⁶ .............................. H05H 1/24; C23C 16/50
[52] U.S. Cl. ...................... 427/569; 427/577; 427/255.5; 427/255.7; 427/249.7; 427/128; 427/131; 427/906; 156/643
[58] Field of Search .................... 427/577, 569, 427/255.7, 255.5, 128, 131, 249, 249.7, 906; 118/723 E, 729; 156/643

[56] References Cited

U.S. PATENT DOCUMENTS

| 4,534,816 | 8/1985 | Chen et al. . |
| 4,578,559 | 3/1986 | Hijikata et al. . |
| 4,663,828 | 5/1987 | Hanak . |
| 4,755,426 | 7/1988 | Kokai et al. ............................. 427/489 |
| 4,910,041 | 3/1990 | Yanagihara et al. . |
| 4,920,917 | 5/1990 | Nakatani et al. . |
| 4,991,542 | 2/1991 | Kohmura et al. . |
| 5,013,583 | 5/1991 | Yamaura et al. ....................... 427/131 |
| 5,022,979 | 6/1991 | Hijikata et al. . |
| 5,102,523 | 4/1992 | Beisswenger et al. ............. 118/723 E |
| 5,104,685 | 4/1992 | Takahashi et al. .................... 427/255.7 |
| 5,203,924 | 4/1993 | Mitani et al. . |
| 5,217,761 | 6/1993 | Okada et al. ............................ 427/579 |
| 5,266,116 | 11/1993 | Fujioka et al. . |
| 5,294,292 | 3/1994 | Yamashita et al. ..................... 156/643 |
| 5,302,424 | 4/1994 | Murai et al. ............................ 427/249 |
| 5,336,326 | 8/1994 | Karner et al. .................... 118/723 HC |
| 5,340,621 | 8/1994 | Matsumoto et al. .................... 427/571 |
| 5,413,673 | 5/1995 | Fujimoto . |
| 5,449,410 | 9/1995 | Chang et al. ....................... 118/723 E |

FOREIGN PATENT DOCUMENTS

| 63-150926 | 6/1988 | Japan . |
| 63-317536 | 12/1988 | Japan . |
| 5-345980 | 12/1993 | Japan . |

OTHER PUBLICATIONS

Wolf, *Silicon Processing for the VLSI Era*, vol. 1, Lattice Press, 1986, pp. 172–173, 544, 570–571. No Month Data.

*Primary Examiner*—Roy V. King
*Attorney, Agent, or Firm*—Sixbey, Friedman, Leedom & Ferguson, P.C.; Gerald J. Ferguson, Jr.; Jeffrey L. Costellia

[57] ABSTRACT

A process for depositing a diamond-like carbon film, which comprises providing a means for generating a sheet-like beam-type plasma region inside a vacuum vessel for depositing the diamond-like carbon film, and depositing the film on a substrate being moved through said plasma region. Also claimed is an apparatus for fabricating a magnetic recording medium by sequentially and continuously forming a magnetic layer and a diamond-like carbon film on a polymer substrate material, which comprises at least a first vacuum vessel for forming the magnetic layer of the magnetic recording medium and a second vacuum vessel for forming the diamond-like carbon film, provided that the pressure difference between the operation pressures for the first vessel and the second vessel is set in the range of from $10^{-2}$ to $10^{-5}$ Torr.

25 Claims, 7 Drawing Sheets

PROCESS FOR FABRICATING A MAGNETIC RECORDING MEDIUM

This application is a continuation of Ser. No. 08/173,961, filed Dec. 28. 1993, now abandoned.

BACKGROUND OF THE INVENTION

1. Field of the Invention

The present invention relates to a rapid process for treating a substrate with a plasma, such as a film deposition process, an etching process and an ashing process. More particularly, the present invention relates to a rapid process for depositing a diamond-like carbon (hereinafter sometimes abbreviated as "DLC") film having superior properties with respect to wear resistance, surface smoothness, insulating properties, hardness, and the like. The present invention also relates to an apparatus for fabricating, on a polymer substrate, a long-endurable magnetic recording medium suitable for mass production, and yet having high recording density. Accordingly, the application field of the present invention covers a wide area ranging from visual equipments to information apparatuses.

2. Prior Art

The application field or diamond-like carbon films is widely spreading these days because the films are as hard as, or even harder than, the conventionally known hard thin films of, for examples TiC, TiN, SiC, $Si_3N_4$, and $Al_2O_3$, and yet, the DLC films can be deposited at room temperature without the application of a heating process.

Recently, a plasma treatment is applied in a wide field of industry to not only a semiconductor process but also a surface of a metal, a fiber and a plastic. Main plasma treatments can be classified into a film formation, an etching and an ashing and the like. Physical vapor deposition (PVD) and chemical vapor deposition (CVD) are known as the film formation. Sputtering is the representative process in the field or PVD (physical vapor deposition), while plasma CVD is the typical one in the field of CVD (chemical vapor deposition). Contrary to CVD, the etching and the ashing are processes in which a substance is removed from a substrate surface by a chemical or physical action of active species activated by the plasma. The CVD is generally carried out in a heated atmosphere, and the etching and the ashing are carried out at room temperature.

A low temperature CVD process for forming a film at a low temperature is desired in variety of application field of CVD in that more kinds of substrate materials can be used in the low temperature CVD process, and cost of the substrate can be reduced by employing the low temperature CVD process. In particular, CVD making use of a kinetic energy of an ion is used for carbon film. The carbon film is formed with the carbon film receiving bombardment by the ion. A bond having a large bond energy is then selectively formed to form a film of high hardness which is collectively called a diamond-like carbon (DLC). Substrata heating is not particularly necessary in the formation of the DLC film as apparent from an elementary process of the formation of the DLC film. Therefore, the DLC films are promising as a variety of protection films from the cost advantage of the DLC films.

A DLC film can be formed by sputtering, e.g. a reactive sputtering using graphite or SiC partially containing silicon as the target material in a mixed gas atmosphere of argon and hydrogen.

FIG. 1 shows schematically the inner structure of a practically used prior art apparatus.

In general, the carbon source material for use as the starting material in the case of forming DLC by CVD include a saturated hydrocarbon gas such as methane ($CH_4$) as described in JP-B-61-53955 or JP-B-62-41476 (the term "JP-B-" as referred to herein signifies an "examined Japanese patent publication") and others containing more carbon atoms per molecule, or an unsaturated hydrocarbon gas such as methylene ($C_2H_4$) and others containing more carbon atoms per molecule. Furthermore, the use of substances containing silicon as partial substituents, such as tetramethylsilane (TMS; $(CH_3)_4Si$) and tetraethylsilane (TES; $(C_2H_5)_4Si$) is also studied.

However, with the prior art film deposition methods or processes using the commercially available conventional apparatuses, it is fundamentally difficult to obtain a DLC film at a high rate of film deposition while maintaining its properties as a protective film at a favorably high level. In other words, a film of superior quality can be obtained only at the expense of the high rate of film deposition. Thus, in depositing a film of sufficiently high quality, a film deposition rate which is practically feasible is approximately in the range of from 0.1 to 0.3 $\mu$m/min. Moreover, the conventional apparatuses and methods for film deposition fail to achieve a satisfactory level of dehydrogenation to sufficiently accelerate the formation of covalent bands between carbon atoms during the deposition of the carbon film.

In addition, it has been difficult to generate and maintain a stable plasma in depositing a film over a large area using the above static methods in which the substrates are fixed. The thermal damage which the substrates suffer upon film deposition at high rate also remains as a problem yet to be solved.

Recently, a higher recording density is required for magnetic recording media. Accordingly, the conventional magnetic recording media such as audio and video tapes which have been fabricated by a coating process, i. e., a process which comprises coating a polymer substrate with a magnetic powder of, for example, $\gamma$-$Fe_2O_3$, CrO, or pure iron, using a binder and an abrasive material, are now being replaced by those having a stable metallic thin-film type magnetic layer obtained by depositing a magnetic metal such as iron (Fe), nickel (Ni), cobalt (Co), and chromium (Cr), using PVD processes (in a broader meaning) such as vacuum deposition, plating, ion plating, and sputtering. In this manner, a magnetic recording media having not only a higher recording density but also a superior coercive force and an improved electromagnetic conversion property can be obtained at a higher productivity.

Recently, the DLC films are also formed using CVD processes represented by a plasma-assisted CVD or any of the PVD processes enumerated above.

It is still difficult to obtain layered thin films having favorable interface characteristics and surface properties using any of the above processes while maintaining a high rate of film deposition, because of the problems such as those associated with the stop of air exposure and the like, and the technically difficult ones concerning synchronizing the deposition or the magnetic film and the DLC film at such a high film deposition rate. It is therefore desired to develop a new process of film deposition.

SUMMARY OF THE INVENTION

The present invention is characterized in that a process for treating a substrate with plasma comprises generating said plasma in the form of a plane in a chamber. The substrate may be moved through the plasma in a direction perpendicular to the plane of the plasma to treat the substrate with the plasma.

It is an object of the present invention to treat a substrate with a plasma at a higher rate. In order to accomplish this object, a plasma is generated intentionally at a high density in a reaction space with a material gas (or a raw material gas) being supplied to said plasma according to a process to be conducted.

Since the region having a high plasma density is confined within a narrow region in the present invention, it is necessary to move a substrate through the region in order to treat a large area surface of the substrate with the plasma. For example, a film can be deposited on the substrate by moving the substrate through the region. Although the substrate movement requires a more complex mechanical structure and an additional cost for the structure, thermal damage can be alleviated by the present invention during the plasma treatment such as a film formation.

Further, a surface of one or both of the anode and cathode is covered with an electrical insulator to stabilize the high density plasma region. The present invention is also characterized in that a dynamic film deposition step is incorporated in the process for the deposition of a diamond-like carbon film. More specifically, the film is deposited on a substrate being moved inside the light-emitting region, i.e., the plasma region of a sheet-like beam-type, in which a light emission of high luminance can be easily realized.

The present invention is also characterized in that dimethylsilane ($Si(CH_3)_2H_2$) and monomethylsilane ($Si(CH_3)H_3$) and the like are used to avoid providing a rate-determining step as the supply of a starting material for the diamond-like carbon film even if the starting material is consumed in a large amount for the plasma.

DETAILED DESCRIPTION OF THE INVENTION

Figure 1A:
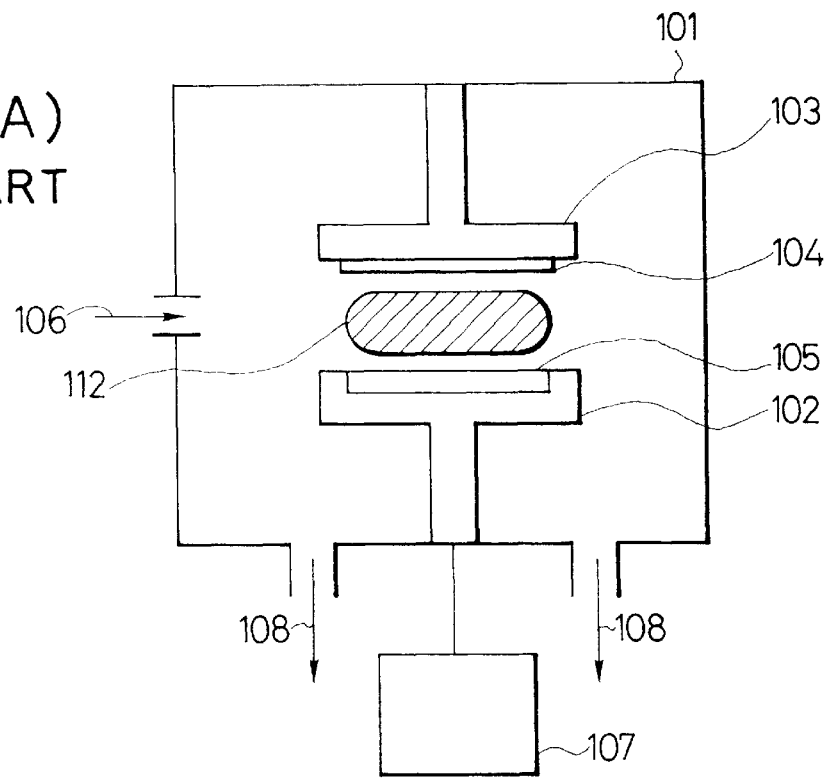
FIGS. 1(A) and 1(B) show cross sectional views of the internal structures of apparatuses for depositing DLC films used in conventional processes.
Figure 1B:
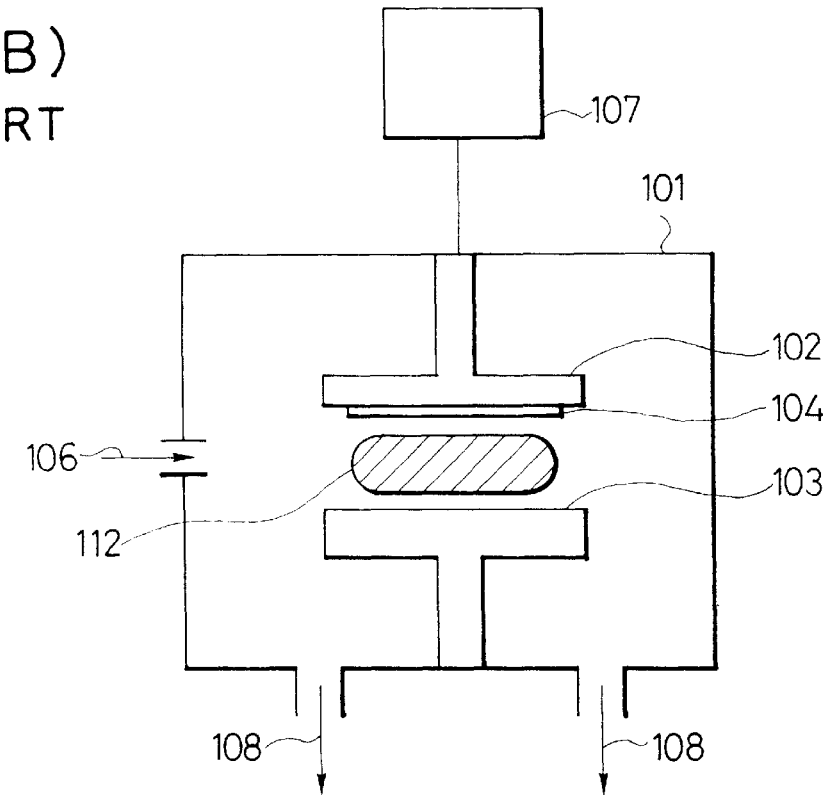

A high density plasma region is formed in the vicinity of a gas supply port in the form of pore or slit provided in a part of the ground electrode, and the starting material is effectively decomposed and activated. For example, in the case of the formation of DLC, a film of high quality is formed at a high rate. A region having a high plasma density is formed in the vicinity of a slit (or a pore) provided on a surface of an anode (i.e. a ground electrode) for supplying the material gas to the plasma, and has an emission brightness much higher than a region therearound to such a degree that the plasma can easily be distinguished by visual observation.

The high density plasma region is formed in the vicinity of the gas supply port in the form of a pore or a slit. This is because the vicinity of the gas supply port has a higher gas pressure than the region other, than said vicinity and therefore a high density plasma is formed in the region having the high gas pressure by applying a sufficient electric field. It is effective to form an edge of the gas exhaust nozzle sharply at the surface of the anode in order to apply a sufficient electric field. This is because the strength of the electric field becomes large in the vicinity of said edge. Also, it is effective to narrow the gap between the anode electrode and the cathode electrode for the reason noted above. The gap between the electrodes is preferably 30 mm or shorter, more preferably 10 mm or shorter to generate a desirable plasma.

It is advantageous to form a plasma in the form of a plane as the high density plasma region. This is because a plane surface of a substrate can be treated with plasma by moving the substrate in one direction perpendicular to the plane of the plasma. In the case where a surface or a substrate in the form of a sheet or tape wound around the drum is treated with plasma, the plasma in the form of a plane is generated in parallel with an axis of the drum, and is apart from the surface of the drum at an appropriate distance, and the drum is revolved in order to treat the surface of the substrate in the form of a sheet or tape with plasma with ease.

The plasma in the form of a plane can be formed by providing a gas exhaust nozzle (gas supply port) in the form of a slit. Also, it is possible to generate a plasma in the form of a plane by arranging pores one-dimensionally. In case of arranging pores one dimensionally, the distance between the adjacent pores should be less than ten times, preferably less than twice, as long as diameter of the pores (the average diameter calculated from length of the major axis and length of the minor axis in the case where the pore is not an circle. The diameter of the pores is 10 mm or shorter, preferably 5 mm or shorter. In the case where the gas supply port is in the form of a slit, the width of the slit is 10 mm or shorter, preferably 5 mm or shorter. The pores are advantageous in that a higher intensity of electric field and a higher density of plasma are produced by the pores rather than by the slit, however, the slit is advantageous in that more uniform plasma is produced by the slit rather than by the pores. In addition, as the width of the slit or the diameter of the pores is decreased, the plasma density increases, however, an upper limit of the gas flow rate decreases. In the case where the width of the slit or the diameter of the pores is too small, the gas flow rate becomes large to increase the plasma density by the local increase of the pressure and to make the plasma unstable. A plasma in the form of a plane having a length of several meters can be produced by lengthening the length of the slit or increasing the number of the pores since the length of the plasma has no theoretical upper limit.

It is effective to cover one or both of the surfaces of the anode and the cathode (in detail, the surface(s) in contact with the plasma) with an electrical insulator in order to stabilize the high density plasma region. Without the cover of the electrical insulator, the plasma discharge would tend to become an arc discharge because an electrical resistance (impedance) of the plasma decreases as the plasma density is increased. The arc discharge is unstable and damages the electrode badly and is not suitable for a stable process although the arc discharge has a high plasma density. The electrical insulator is used in the present invention to prevent the arc discharge from occurring. $SiO_2$, $Al_2O_3$, $ZrO_2$, PZT and the like are suitable for the insulator. Though depending on a frequency of a power source, in the case where a discharge is caused at a relatively low frequency (less than order of kHz), the specific dielectric constant of the insulator is important. The specific dielectric constant is preferably 2 or more, more preferably 5 or more. The insulator is formed as thin as possible as long as the withstand voltage thereof is sufficient. The thickness of the insulator is 3 mm or less, preferably 1 mm or less.

Of course, it is possible to form a high density plasma even if both of the electrodes are not insulated. It is preferable to insulate the electrode(s) in order to stabilize the plasma. On the other hand, a capacitance is formed by the provision of the insulator from the point of electric circuit view to increase an impedance between the electrodes. Accordingly, the plasma density decreases without supplying electric power effectively. It is advantageous not to provide the insulator unless there is a problem of stability.

The high density plasma region has an intimate relation with a local pressure in the vicinity of gas exhaust nozzle, Therefore, the length of the high density plasma region can be adjusted through variation of the gas flow velocity by adjustment of the gas flow rate. By this, the substrate surface can be in contact with and not in contact with the high density plasma region even if the distance between the substrate and the plasma generation apparatus is not varied. Of course, this is possible also in the case where the distance between the substrate and the plasma generation apparatus is varied. In the case where the substrate is in contact with the high density plasma region, the plasma treatment can be affected at a high speed, however, the substrate receives damage. In the case where the substrate is not in contact with the high density plasma region, the substrate is free from bombardment thereto by an ion, and only neutral active species contribute to reaction, resulting in no damage to the substrate. But reaction speed and quality of the product after the reaction is not so good only by the neutral active species if the plasma treatment is carried out at room temperature. In this case, heating from room temperature to 300° C. is necessary.

Pressure inside the reaction space is 800 to 0.1 Torr, preferably 5 to 0.5 Torr. This pressure does not mean a local pressure in the vicinity of the gas exhaust nozzle but means a measurable pressure of a region other than said vicinity. Mean free path is meaningful in the above range. If the pressure is too low, gas diffuses before the local pressure in the vicinity of the exhaust nozzle increases sufficiently. If the pressure is too high, electrons collide with each other before the electrons obtain energies necessary to start discharge, with the result that the discharge can not start, In the case where the electrode is not covered with the insulator, the electric field applied to the electrode may be DC or AC.

In the case where the electrode is covered with the insulator, it is necessary to apply an AC electric field thereto. The frequency can be increased to an upper limit at which the electric field can be applied between the parallel plate type electrodes. In the case where the electrode is not covered with the insulator, there is no lower limit of the frequency. In the case where the electrode is covered with the insulator, the lower limit is determined by specific dielectric constant and thickness of the insulator. In practical use, 10 Hz to 2 GHz is possible, and 50 Hz to 900 MHz is preferable. The supplied electric power density is 0.1 to 10 $W/cm^2$ preferably 0.5 to 3 $W/cm^2$.

A variety of processes are possible by using the above-described plasma treatment apparatus such as a film formation process, an etching process and an ashing process as representative.

Examples of the film formation process are processes for forming a semiconductor film (such as amorphous silicon), a dielectric film (such as a silicon oxide film, a silicon nitride film and a titanium oxide film), a metallic film made of e.g. tungsten and other films which could be formed by a conventional chemical vapor deposition. In particular, the present invention has a lot of advantages in the case where a film containing carbon as a main ingredient for use as a protection film of abrasion proof and lubricity is formed by the plasma treatment apparatus of the present invention. A cathode is bombarded by an ion by self-bias if the cathode is supplied with an electric energy through capacitance coupling. Therefore, if the substrate is provided on the cathode, the film is formed on the substrate surface with the substrate surface receiving the bombardment of the ion. This is necessary for an elementary process for forming a carbon film of high hardness as described above. The present invention is advantageous in that the plasma treatment can be carried out at room temperature since the film containing carbon as a main ingredient used as a protective film of abrasion proof and lubricity is often formed on a substrate which can not be kept at a high temperature, such as an organic resin substrate and a magnetic substrate (e.g. a magnetic tape and a magnetic optical disc and the like). In addition, since a high density plasma can be produced by the apparatus of the present invention to conduct the film formation at a high speed. In this way, an apparatus which is excellent in mass-production can be realized.

Since starting materials as specified above are used, not only the probability of the existence of methyl groups ($CH_3$) can be increased, but also the effect of dehydrogenation can be greatly increased.

The specific materials above can be easily handled, and, moreover, the maintenance and administrative regulations are far relaxed as compared with those for the conventional so-called high-pressure gases. Concerns on environmental pollution of the discharge gas can also be minimized.

The etching of the present invention is same as the film formation of the present invention except that the material gas is replaced by an etching gas. A simple gas comprising an element selected from the group consisting of fluorine, chlorine and bromine, or a gas mixture of an inert gas and the above simple gas can be used as the etching gas. A substrate comprising silicon, a silicon compound, carbon, or an organic substance or the like can be etched. Ashing is a special case of an etching, and oxygen is used as a material gas. An inert gas may be mixed with the material gas. Ashing by the apparatus of the present invention is suitable for peeling a resist. That is, a time required for the treatment is shortened in the same manner as the film formation to lower the cost. Further, it is effective to treat the substrate with plasma by positively exposing the substrate to a high density plasma region in case of ashing. This is because the substrate is heated by bombardment from the high density plasma region thereto to contribute to increase of a reaction speed.

In the process according to the present invention, the separate film deposition regions are organically and rationally linked into synchronizing regions. This is achieved by adjusting, to a desired value, the pressure difference among the operation pressures of the independent steps for a non-continuous process comprising a plurality of different film deposition steps. In this manner, the mass production of highly reliable magnetic recording media having isotropic magnetic properties for in-plane recording is realized.

The process according to the present invention implements groups of layered thin films having excellent properties with respect to, for example, interface characteristics, adhesiveness, surface properties, and the like. This is realized by changing the operation pressure inside the film deposition region (vacuum vessel) which is subjected to a plurality of steps, either step-wise or in a graded manner. The resulting vacuum apparatus not only operates in good condition and functionally, but also effectively provides films of superior quality, The present invention is illustrated in greater detail referring to non-limiting examples below, It should be understood, however, that the present invention is not to be construed as being limited thereto.

EXAMPLE 1

Figure 2:
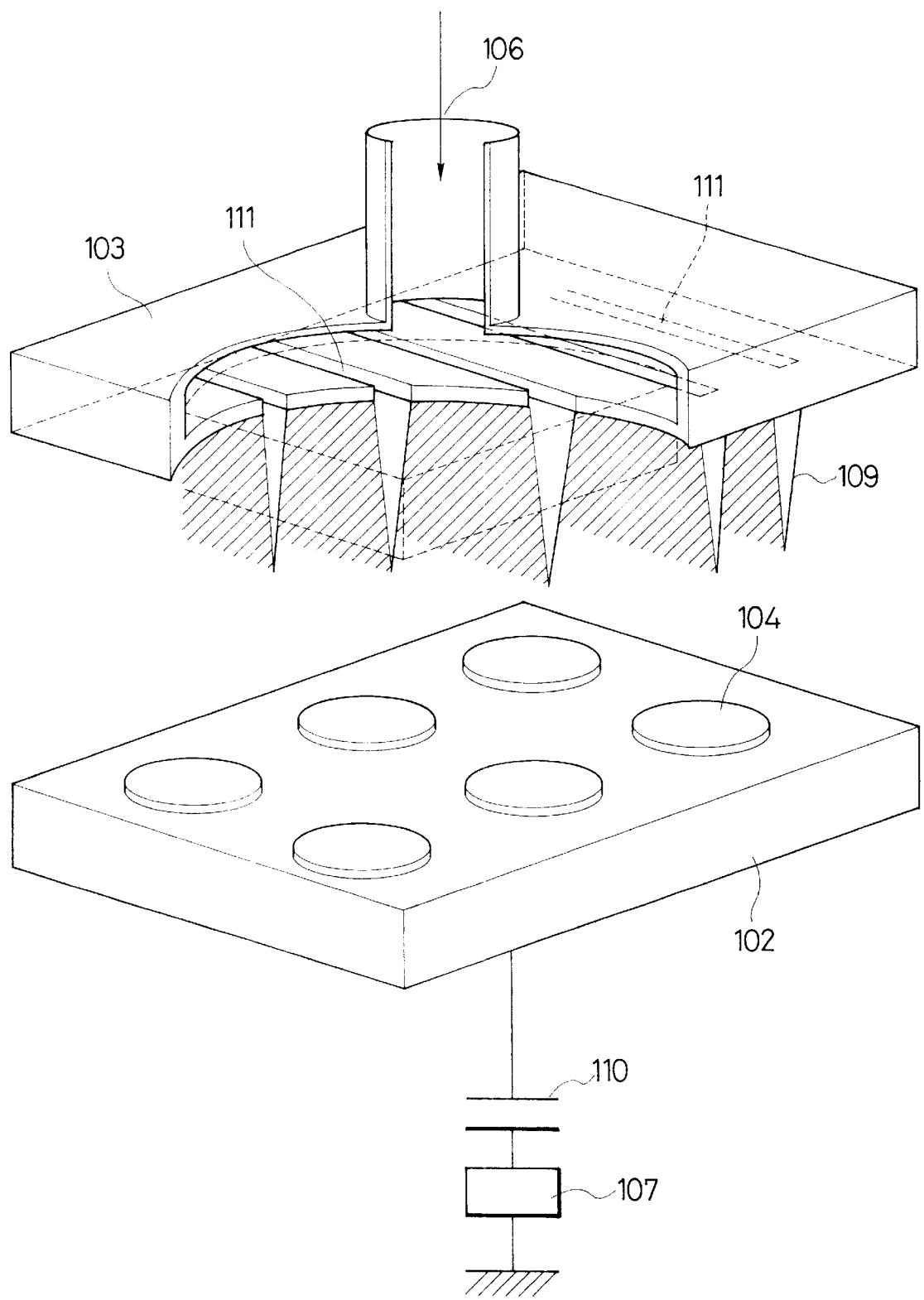
FIG. 2 shows a cross sectional view of the internal structure of an apparatus for depositing DLC films according to the present invention.

Referring to FIG. 2, the invention according to the present invention is described below. In this example, formation of a diamond-like carbon film (DLC) by the use of a dimethylsilane ($Si(CH_3)_2H_2$) is described.

The apparatus for use in the process for depositing a DLC film according to the present invention comprises special devices for use in the steps of transporting the substrates and in the supply of high frequency power, because substrates 104 are placed on one side of an electrode 102 for supplying high frequency power. The electrode 102 for supplying high frequency power is placed at a distance of 1 cm from a ground electrode 103, and the both are placed inside a vacuum vessel 101. The electrode 102 for supplying high frequency power also functions as a substrate holder to support the substrates, for instance, in this example, 12 pieces of 3.5-inch magnetic diskettes are used as the substrates having thereon a magnetic layer. The transport system comprises components such as rails, racks, and pinions, which are made of insulators. Thus, they are DC-insulated and are arranged in a floating structure.

The high frequency power is supplied from a high frequency power source 107 via an indirect capacitive coupling 110 based on a vacuum gap.

A method for generating a one-dimensional high density plasma region having a high-luminance light emission is described specifically below.

In the structure described above, the starting material, i.e., dimethylsilane ($Si(CH_3)_2H_2$) as the carbon source, is introduced from a material supply system 106 at a flow rate of 20 SCCM (standard cubic centimeters per minute) to set the operation pressure to 1 Torr, while evacuating an evacuation system 108.

Because the ground electrode 103 has a hollow structure, the carbon source material is transported into a space between the electrodes through gas supply inlets 111 which are precisely processed to make a slit 0.5 cm in width and 30 cm in length. Then, a linear one-dimensional high density plasma region 109 having a high luminance light emission can be locally generated by applying a high frequency power at a power density of 2 W/cm² from the high frequency power source system 107. The substrates 104 are transferred through the plasma region at a rate of 90 m/min to form a 200 Å thick DLC film on the magnetic layer of the magnetic diskette. The number of the slits per centimeter is 1.

It can be seen that the process according to the present invention is advantageous in that the vacuum vessel itself can be made compact, not only because the volume of the space of plasma discharge is reduced by narrowing the gap between the electrodes, but also because the vessel itself can be constructed from thinner walls.

Furthermore, instead of a conventional plasma region widely spread over the entire space between the electrodes, the region for film deposition in the process according to the present invention is confined to a limited area in the vicinity of the slit-like gas supply inlet 111 of the ground electrode 103. In this manner, a dynamic process for film deposition can be implemented with ease.

Figure 3:
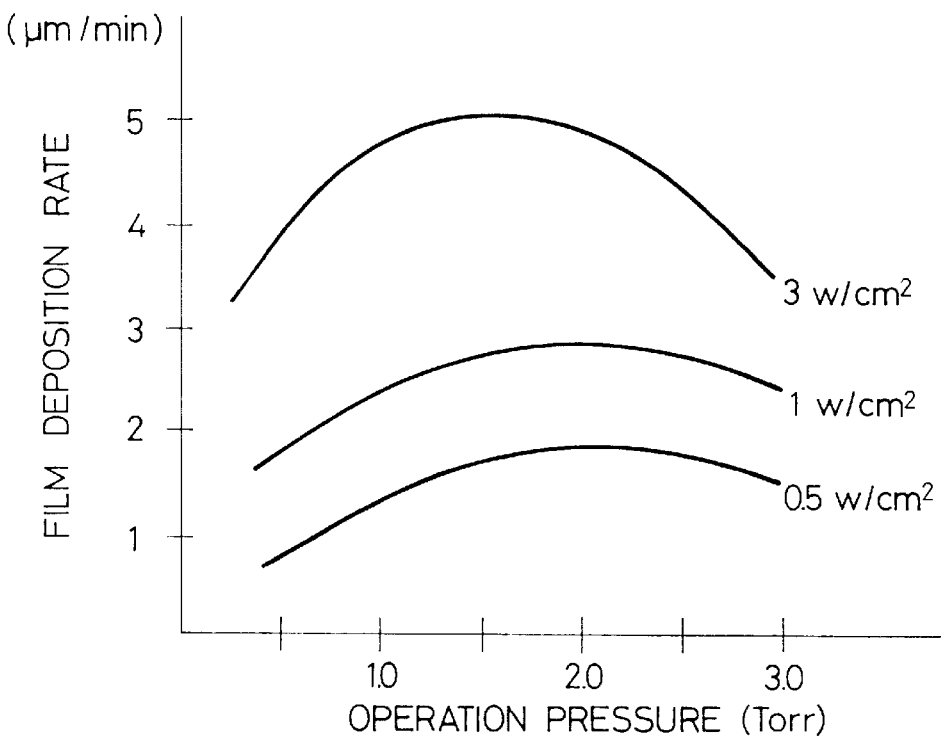
FIG. 3 is a graph showing the dependence of film deposition rate on the operation pressure and on the density of high frequency power for a DLC film obtained In Example 1 according to the present invention.

FIG. 3 is a graph illustrating the dependence of film deposition rate on the operation pressure and on the density of high frequency power for a DLC film obtained in the present Example using substrates on the electrode, i.e., substrates in a dynamic state.

It can be seen that, as compared with the prior art film deposition processes in which the films are deposited at a rate of from about 0.1 to 0.3 µm/min, the DLC film of a similar quality can be deposited by the process according to the present invention at a film deposition rate higher by a digit than the rate of a conventional process. This high deposition rate is achieved owing partially to the use of a novel starting material. Furthermore, it is confirmed that the value of the residual internal stress of the film obtained by the process according to the present invention is reduced by about a half to one digit as compared with the value obtained for a film deposited by a conventional process.

EXAMPLE 2

A DLC film is deposited in the same manner as described in Example 1, except for using monomethylsilane ($Si(CH_3)H_3$) in the place of dimethylsilane ($Si(CH_3)_2H_2$).

As expected, the film deposition rate is found to be lowered by about 35% as compared with the rate for the process of Example 1. However, tendencies similar to the case of Example 1 are observed concerning the film deposition conditions such as the dependence on operation pressure and on the density of high frequency power.

The amount of unfavorable deposition of carbon coating (such as amorphous carbon and graphite) on the inner walls of vacuum vessel, electrodes, and the like, is found to be extremely reduced as compared with the case in Example 1. Thus, it is found that the case of Example 2 using monomethylsilane ($Si(CH_3)H_3$) is superior to the case in Example 1 considering the maintenance and control of the apparatus.

Figure 4:
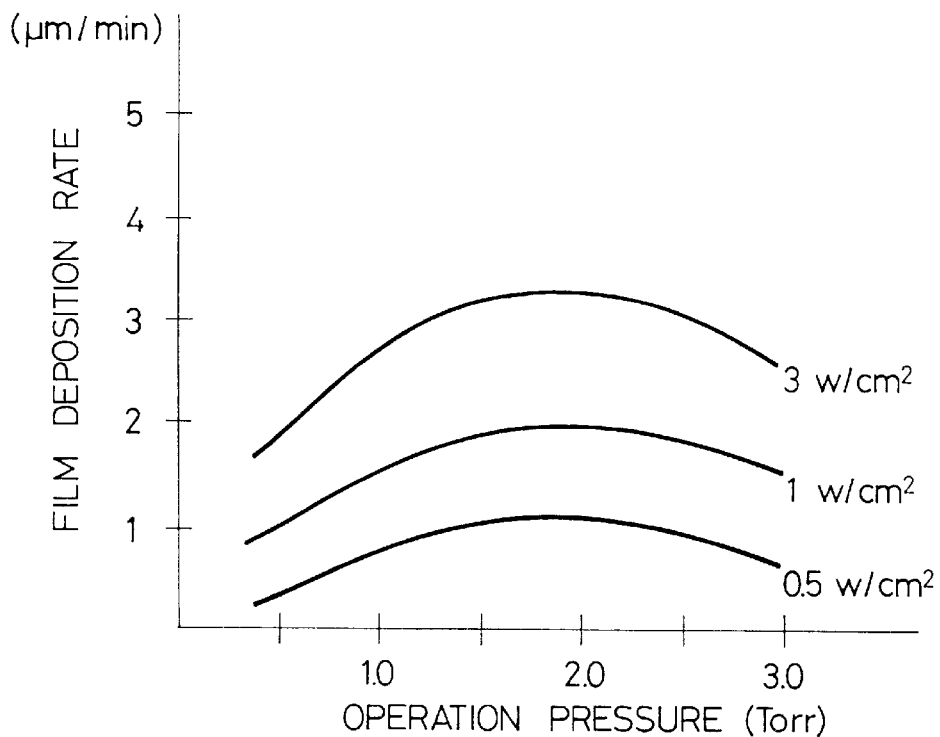
FIG. 4 is a graph showing the dependence of film deposition rate on the operation pressure and on the density of high frequency power for a DLC film obtained in Example 2 according to the present invention.

FIG. 4 is a graph similar to FIG. 3, except that the properties are measured on the film fabricated in Example 2.

EXAMPLE 3

Referring to FIGS. 5 to 8, a process according to an embodiment of the present invention is described below.

Figure 5:
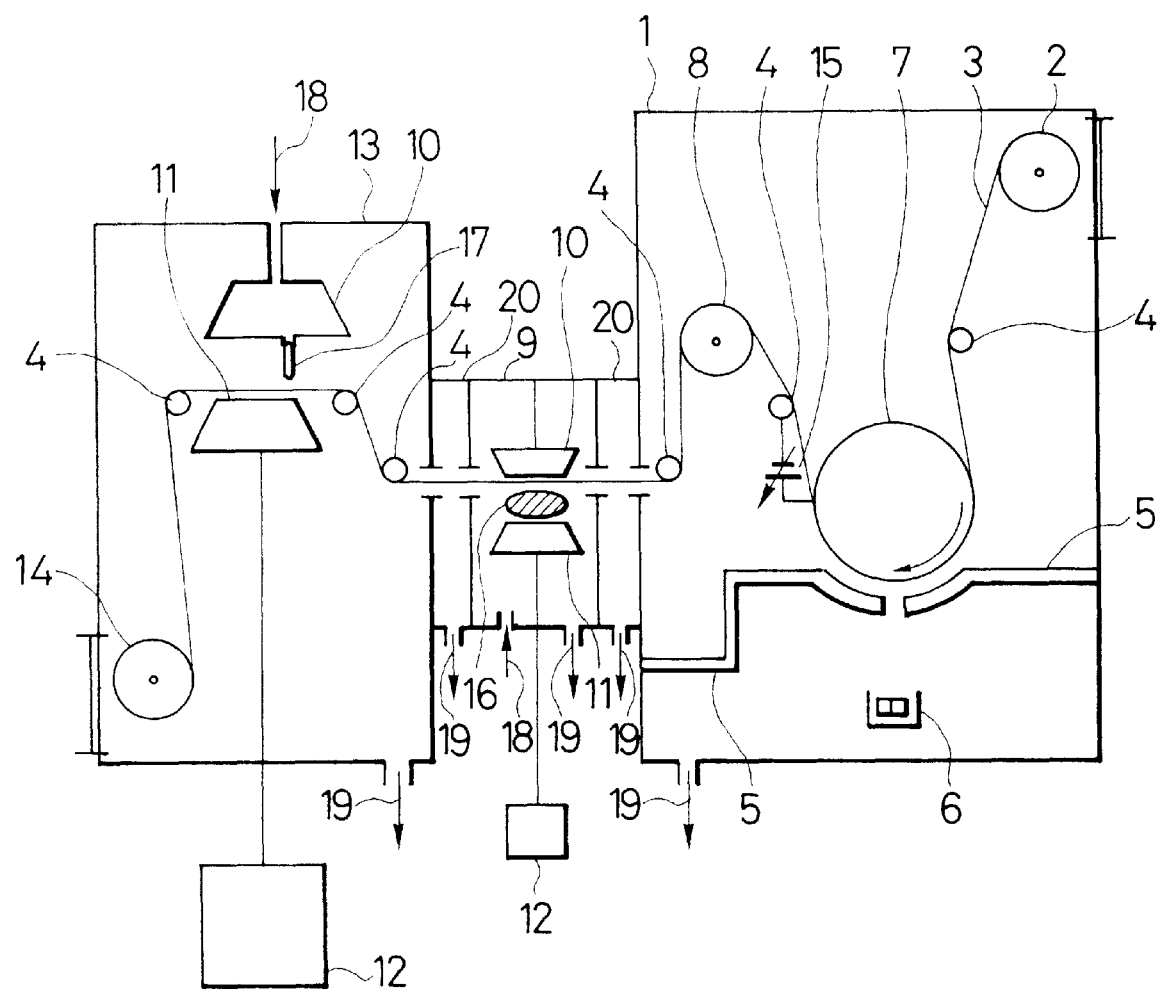
FIG. 5 is a cross sectional view of the internal structure of an apparatus for fabricating a magnetic recording medium according to an embodiment of the present invention.

In a vacuum vessel 1 as shown in FIG. 5, a polymer substrate material 3 is fed from a supply roll 2 being run along a cylindrical can 7 in the direction indicated with an arrow via a free roller guide 4. The polymer substrate material 3 used in this Example is a polyimide film 50 cm in width and 6 µm in thickness.

Figure 6:
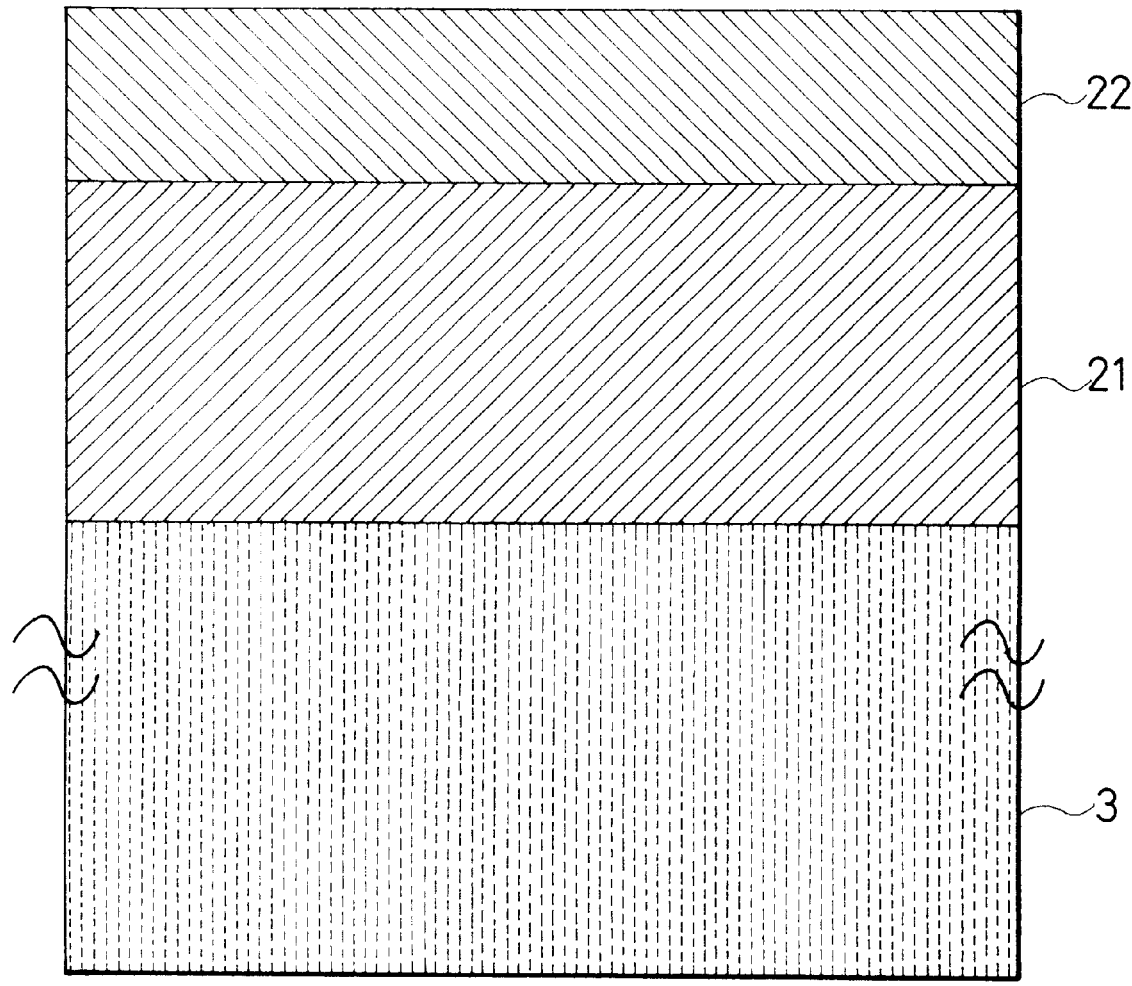
FIG. 6 is a cross sectional view or a magnetic recording medium obtained according to an embodiment of the present invention.

The vaporized metal atoms that are supplied from an evaporation source 6 are deposited on the polymer substrate material 3 to provide a 0.15 to 0.18 µm thick magnetic layer 21 as shown in FIG. 6.

In the present Example, a Co—Cr—Ni alloy is used as the evaporation source. Furthermore, a pierce-type electron gun capable of scanning over a wide area is operated at an accelerating voltage of 35 kV under an operation pressure of $5\times10^{-4}$ Torr to deposit a film by electron beam vacuum deposition process. The rate of transferring the polymer substrate material 3 is fixed to 135 m/min. A shield plate 5 is provided for confining the area of film deposition.

The potential difference is provided between the cylindrical can 7 and the deposited magnetic layer 21 using a DC power source 15 via a free roller guide 4. By applying a voltage of 80 V and thereby applying an electrostatic force in the manner described above, the polymer substrate material 3 is brought into intimate contact with the cylindrical can 7.

The polymer substrate material 3 having thereon the magnetic layer is introduced to another vacuum vessel 9 via an intermediate roll 8, and is subjected to plasma activation treatment.

The step of plasma activation treatment is explained below.

In this step, the operating pressure is kept in the range of from $10^{-1}$ to $10^{-2}$ Torr by introducing hydrogen gas from a gas supply system 18 into a space between an earth electrode 10 and an electrode 11 for supplying high frequency power which are arranged in parallel to each other at a distance of 3 cm, while evacuating using an evacuation system 19. A 13.56-MHz high frequency power is applied to the space between the electrodes at a power density of 0.5 W/cm$^2$ using a high frequency power source system 12 to generate a hydrogen plasma between the electrodes. Then, the polymer substrate material 3 is transferred through this plasma region 16 at a rate synchronized with the step of forming the magnetic layer.

In this manner, the surface of the magnetic layer 21 is properly cleaned by exposure to the active hydrogen radicals or hydrogen ions, and is activated at the same time. It is confirmed that similar effects are obtained in the case using argon gas or a mixed gas of argon and hydrogen.

By the way, an opening provided on a partition partitioning the vacuum vessel 9 and a buffer chamber 20 is provided to transfer the polymer substrate material 3 therethrough and has a size smaller than a Debye distance of the plasma generated in the vacuum vessel 9 or smaller than a mean free path under a pressure of the plasma region 16. In such a size, the plasma does not escape into the buffer chamber 20.

A process which takes place inside another vacuum vessel 13 which defines the region for depositing a DLC film 22 according to the present invention is described below.

The polymer substrate material 3 having thereon the magnetic layer 21, which is introduced into the vessel 13 via a free guide roller 4, is passed through a sheet-like beam-type plasma region 17. In this manner, a high quality DLC film 22 can be formed on the polymer substrate material 3.

More specifically, the sheet-like beam-type plasma region 17 is generated by, for example, a process as described below.

The operation pressure is controlled to keep a value of 1 Torr by supplying ethylene gas as the carbon source between the earth electrode 10 and the electrode 11 for supplying high frequency power. The electrodes are arranged in parallel to each other and a distance of 1 cm is precisely kept therebetween. Because the earth electrode 10 is provided in a hollow structure, the carbon source material is transported into a space between the electrodes through a gas supply inlet which is precisely machined to make a slit from 0.5 to 1.0 cm in width and 60 cm in length. Then, a linear plasma region having a high luminance light emission is locally generated by applying a high frequency power at a power density of 3 W/cm$^2$ from the high frequency power source system 12. The substrates are then transported through the plasma region at a rate interlocked with the rates of the aforementioned two steps to form thereon a 200 Å thick diamond film. The resulting film is taken up using a take up roll 14. The key in this step is that the polymer substrate material 3 is run on the electrode 11 for supplying high frequency power.

In depositing a DLC film 22 on the substrate, i.e., the polymer substrate material 3, the substrate is fixed on the electrode 11 for supplying high frequency power. Concerning the mobility, mass, and the like of the species in the plasma, e.g., molecules, atoms, cations and anions, radicals, etc., electrons are the only species which accumulate on the surface of the substrate and on the electrode 11 for supplying high frequency power. Thus, an electric field is formed between the plasma potential and the self bias potential which is generated in the vicinity of the electrode 11 for supplying high frequency power due to the electrons described above. Then, the cations are accelerated in the electric field and undergo collision with the DLC film which is being deposited. In this manner, the physical and chemical reactions are accelerated to reduce the number of double bonds among carbon atoms (C=C), thereby increasing the fraction of carbon atoms having saturated carbon atoms (C—C). Then, a film of superior quality can be obtained.

It is also possible to overcome the problem of causing thermal damage to the substrate by running the polymer substrate material 3 at a predetermined rate on the electrode 11 for supplying high frequency power. Thus, it is possible to prevent the thermal damage of the substrate from occurring, because such thermal damages occur when the substrates are fixed and subjected to a static process in which the film is deposited at a high rate of film deposition.

FIG. 6 shows the cross sectional view of a magnetic recording medium fabricated by the film deposition steps above. It can be seen that a favorable interface is obtained between the magnetic layer 21 and the DLC film 22.

Figure 7:
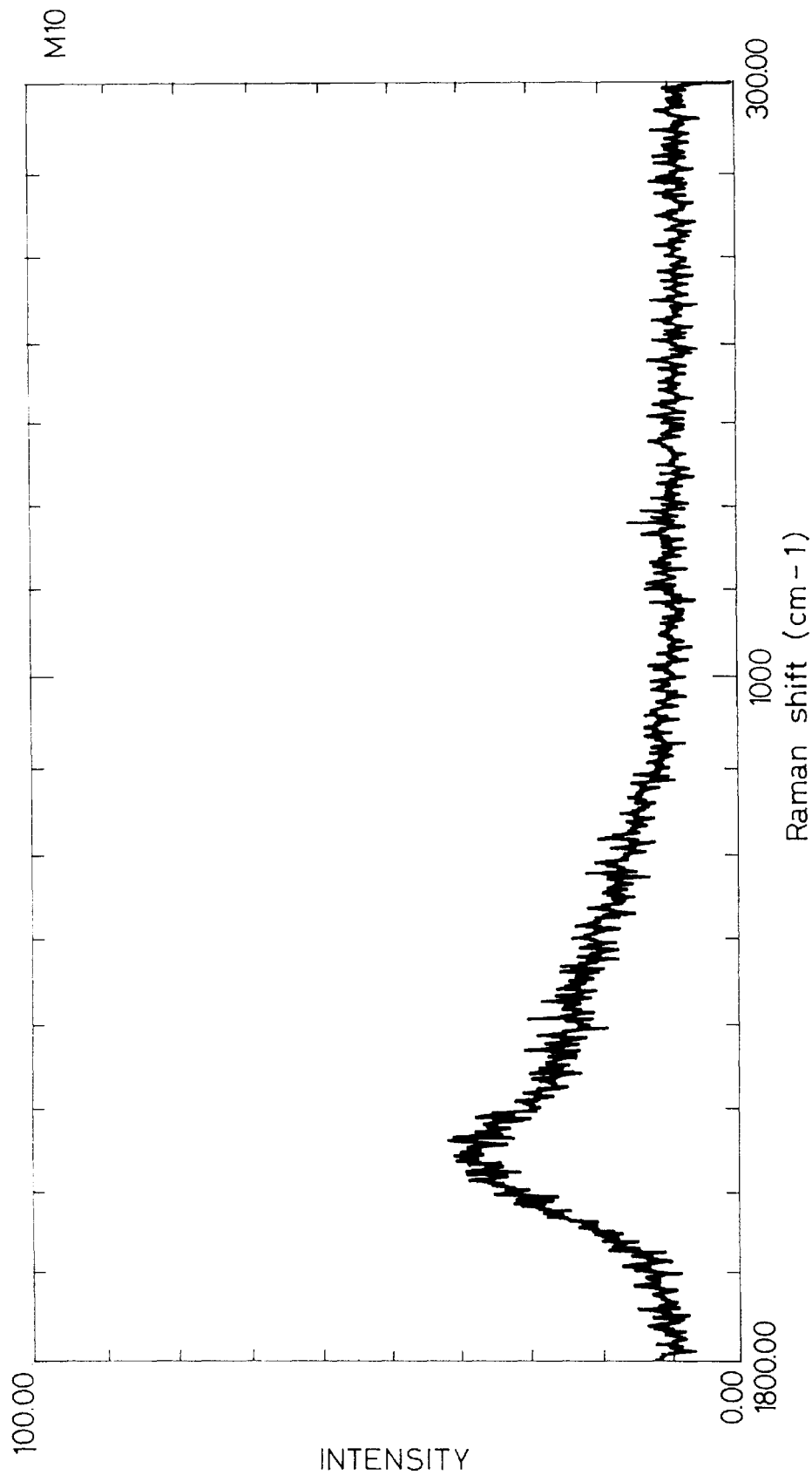
FIG. 7 is a Raman spectrum of a DLC film or a magnetic recording medium according to an embodiment of the present invention.

FIG. 7 shows the Raman spectrogram of the DLC film 22 obtained in the Example according to the present invention. It can be seen that a film of superior quality is obtained even when the film is deposited at a high rate.

In the process according to the present invention, the substrate material may be subjected to a pretreatment before forming the magnetic layer 21, if necessary. The pretreatment is performed using any of the known techniques, such as the irradiation of ions, electrons, etc., or heating. Furthermore, the substrate material may not be the same material as the one used in the present example, i.e., polyimide. Other materials applicable to the present invention as substrates include metals, resins, and plastics, which may be shaped into rolls or sheets.

Figure 8:
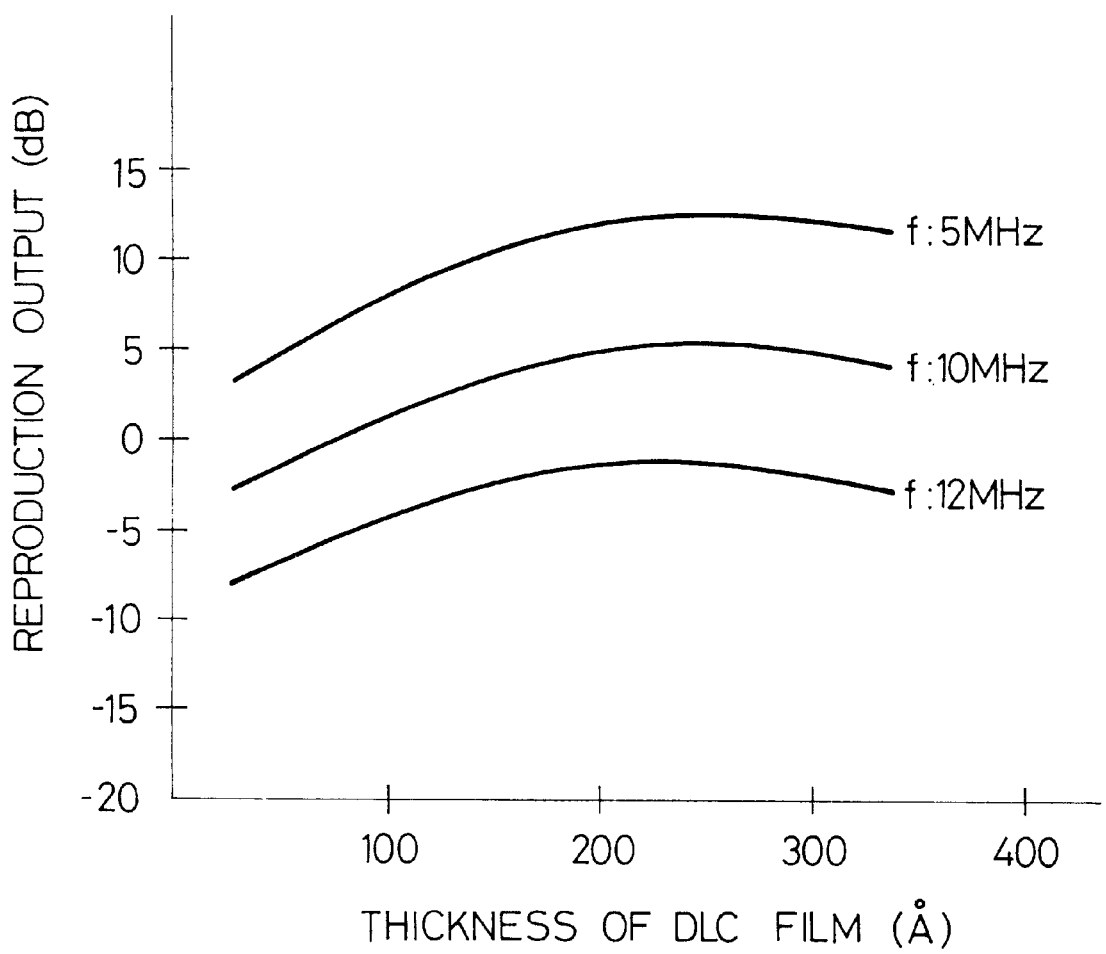
FIG. 8 is a graph which shows the change of reproduced output with the change in the film thickness of a DLC film according to an embodiment of the present invention.

FIG. 8 shows the results obtained on the DLC film 22, by evaluating the reproduction output with changing film thickness. The recording frequency is also varied. It can be seen that the reproduction output tends to yield a constant value for DLC films 22 whose thickness exceeds a value of 200 Å, thereby suggesting the importance of surface smoothness.

Then, the thus fabricated magnetic recording medium is cut into tapes 8 mm in width, and the tapes are subjected to tests to evaluate the reproduction output and durability using a commercially available 8-mm video tape deck. A stable reproduction output with less dropouts is obtained for tapes having thereon a DLC film 22 at a thickness of 200 Å or more; excellent still durability and running stability are also obtained for such tapes.

In addition to the excellent durability in normal reproduction operation, it is also confirmed that the above tapes yield superior durability even in special tests of continuous and continual operations.

EXAMPLE 4

In this EXAMPLE 4, an etching is conducted using $NF_3$ as an etching gas in the apparatus of EXAMPLE 1. A silicon wafer is used as a substrate. $NF_3$ is supplied from a raw material supply system 106 at 200 sccm. Pressure inside the reaction vessel is kept at 3 Torr. A high frequency energy is applied from a high frequency power source 107 at a power density of 3 $W/cm^2$ to generate a plasma. A substrate holder is moved in a direction perpendicular to the generated one-dimensional high density plasma at a speed of 1 cm/sec. A surface of the substrate is subjected to an etching with the surface of the substrate being in contact with the high density plasma region. After one scanning, the surface of the silicon wafer is etched to a depth of 0.4 $\mu$m.

EXAMPLE 5

Ashing is conducted using $O_2$ as an ashing gas in the apparatus of EXAMPLE 1.

A glass of 100 mm in diagonal is used as a substrate. This substrate is used in a process for producing a TFT for LCD. Ashing performance for peeling a resist after an ion doping for formation of a channel is examined in this EXAMPLE 5.

A positive type resist OFPR-800 manufactured by Tokyo Ouka Cp., Ltd. having a viscosity of 30 cps is used as the resist. The resist is formed as follows. Spin-coating is performed and then pre-baking is performed for 20 minutes at 80° C. Light irradiation is carried out for 20 seconds by an ultraviolet ray at a center wavelength of 365 nm at 2 mW with a mask. Then, development is carried out for one minute by a developing solution NMD3 manufactured by Tokyo Ouka Co., Ltd. Washing is performed and then post-baking is performed for 30 minutes at 130° C. Thickness of the resist is 2 $\mu$m after this post-baking.

Thereafter, boron is ion-doped at $1\times10^{19}$ atoms/$cm^2$ by ion implantation.

Since the resist subjected to the ion implantation is heated by the ion implantation, the resist can hardly be peeled by a peeling agent Stripper 10 manufactured by Tokyo Ouka Co., Ltd.

Ashing of the resist provided on the substrate is carried out by the use of the above-described apparatus under the following discharging condition.

Gap between electrodes: 10 mm

Width of slit: 5 mm

Length of the slit: 30 cm

Frequency of applied electric field: 13.56 MHz

Applied electric power: 5 $W/cm^2$

Reaction gas: oxygen oxygen flow rate: 500 sccm

Scanning speed of substrate: 50 mm/min.

It was confirmed that the resist was ashed and removed by once scanning the resist provided on the substrate through the plasma generated under the above condition. This corresponds to an ashing rate of 8000 Å/min., provided that an effective treatment area extends to a width of 5 mm without movement of the substrate. This rate of 8000 Å/min. is much higher than a rate of 1000 Å/min. obtained by barrel type.

A sufficiently good characteristic of TFT is obtained by the present example. No damage is observed in the substrate treatment of the present invention.

As described in the foregoing, the process speed is increased in any application to such as a film formation, an etching and an ashing by using a plasma apparatus and a plasma process according to the present invention. The present invention is then suitable for mass-production. In particular, the film containing carbon as a main ingredient formed by the present invention has superior properties with respect to, for example, wear resistance, surface smoothness, high insulating properties, and hardness. Moreover, the problem concerning the rate-controlling factor, i.e., the supply rate of the material gas, is also overcome by the present invention to enable mass production of the DLC films. Further, throughput of the ashing is extremely improved.

Since the process according the present invention is not based on the conventional static process, it is also confirmed that the present process does not induce damages on the substrate even when the film is deposited at a high film deposition rate.

It is further confirmed that the silicon-containing materials, i.e., dimethylsilane ($Si(CH_3)_2H_2$) and monomethylsilane ($Si(CH_3)H_3$) are excellent materials from the viewpoint of conformity with the underlying substrate material in case of depositing a film containing carbon as a main ingredient, and that they yield superior interface properties and adhesion strength when the film containing carbon as a main ingredient is deposited on the substrate material.

The magnetic recording media fabricated by the apparatus according to the present invention comprises an interface between the magnetic layer and the diamond-like carbon film exhibiting improved interface properties and adhesion strength. It is fundamentally impossible to remove lower oxides from the surface of the magnetic layer by simply avoiding the surface from being exposed to the atmosphere, however, it is still effective to perform the plasma activation treatment according to the present invention.

The present invention provides diamond-like carbon films having considerably improved surface properties, i.e., excellent resistance to wear, smooth surface, and a high level of hardness. Accordingly, the DLC film according to the present invention enables the fabrication of industrially valuable magnetic recording media. Furthermore, the present invention circumvents the rate-controlling factor from being incorporated in realizing continuous film deposition.

While the invention has been described in detail and with reference to specific embodiments thereof, it will be apparent to one skilled in the art that various changes and modifications can be made therein without departing from the spirit and scope thereof.

What is claimed is:

1. A process for treating a substrate with a plasma comprising the steps of:

generating a sheet beam plasma in a reaction chamber using a raw material gas introduced into said reaction chamber through a continuous slit-like inlet, said sheet beam plasma having a cross-section extending one-dimensionally taken along a plane parallel to said substrate; and moving said substrate on an electrode for supplying high frequency power, perpendicularly to a direction in which said cross section of the sheet beam plasma extends with said substrate being exposed to said sheet beam plasma, wherein said slit-like inlet is provided in a ground electrode to form the plasma in the vicinity of said slit-like inlet.

2. The process of claim 1 wherein said substrate is a magnetic tape or a magnetic disc.

3. The process of claim 1 wherein said substrate is a magnetic tape or a magnetic disc.

4. The process of claim 1 wherein said slit-like inlet is elongated in said direction in which said cross section of the sheet beam plasma extends.

5. A process for treating a substrate with a plasma comprising the steps of:

generating a plurality of sheet beam plasmas perpendicularly to a substrate in a reaction chamber using a raw material gas introduced into said reaction chamber through continuous slit-like inlets, each of said plasmas being separated from one another and being generated from the corresponding one of said continuous slit-like inlets; and moving said substrate on an electrode for supplying high frequency power with said sheet beam plasmas being kept perpendicularly to said substrate and with said substrate being exposed to said sheet beam plasmas, wherein said slit-like inlets are provided in a ground electrode to form the plasmas in the vicinity of said slit-like inlets.

6. The process of claim 5 wherein each of said sheet beam plasmas has a cross-section extending one-dimensionally taken along a plane parallel to said substrate.

7. The process of claim 5 wherein said substrate is a magnetic tape or a magnetic disc.

8. The process of claim 5 wherein said slit-like inlets are elongated in a direction in which cross sections of the sheet beam plasmas taken along a plane parallel to said substrate extend.

9. A process for treating a substrate with a plasma comprising the steps of:

generating a sheet beam plasma perpendicularly to a substrate in a reaction chamber using a raw material gas introduced into said reaction chamber through a continuous slit-like inlet; and moving said substrate on an electrode for supplying high frequency power with said sheet beam plasma being kept perpendicularly to said substrate and with said substrate being exposed to said sheet beam plasma, to form a diamond-like carbon film on said substrate, wherein said slit-like inlet is provided in a ground electrode to form the plasma in the vicinity of said slit-like inlet.

10. The process of claim 9 wherein said diamond-like carbon film is deposited up on a lower surface of said substrate.

11. The process of claim 9 wherein said diamond-like carbon film is deposited down on an upper surface of said substrate.

12. The process of claim 9 wherein said sheet beam plasma has a cross-section extending one-dimensionally taken along a plane parallel to said substrate.

13. The process of claim 9 wherein said substrate is a magnetic tape or a magnetic disc.

14. The process of claim 9 wherein said slit-like inlet is elongated in a direction in which a cross section of the sheet beam plasma taken along a plane parallel to said substrate extends.

15. A process for treating a substrate with a plasma comprising the steps of:

forming an underlying film on a substrate;

generating a sheet beam plasma perpendicularly to said substrate in a reaction chamber using a raw material gas introduced into said reaction chamber through a continuous slit-like inlet; and moving said underlying film formed on said substrate on an electrode for supplying high frequency power with said sheet beam plasma being kept perpendicularly to said substrate and with said underlying film formed on said substrate being exposed to said sheet beam plasma, to form a diamond-like carbon film on said underlying film, wherein said slit-like inlet is provided in a ground electrode to form the plasma in the vicinity of said slit-like inlet.

16. The process of claim 15 wherein said underlying film comprises a magnetic layer.

17. The process of claim 15 wherein said sheet beam plasma has a cross-section extending one-dimensionally taken along a plane parallel to said substrate.

18. The process of claim 15 wherein said slit-like inlet is elongated in a direction in which a cross section of the sheet beam plasma taken along a plane parallel to said substrate extends.

19. A plasma process method comprising the steps of:

preparing a ground electrode and an electrode for supplying high frequency power in a reaction chamber, said electrode having a gas inlet hole extending in one direction on a surface thereof;

disposing a substrate between said ground electrode and said electrode for supplying high frequency power to dispose a surface of said substrate adjacent to the surface of said ground electrode with a space between said ground electrode and the surface of said substrate;

introducing a reactive gas into said reaction chamber through said inlet hole provided in said ground electrode so that said reactive gas is directed perpendicularly to the surface of said substrate from said inlet hole;

applying a voltage between said ground electrode and said electrode for supplying high frequency power in order to produce a sheet beam plasma of said reactive gas in the vicinity of said inlet hole wherein said plasma is directed perpendicularly to the surface of said substrate and has a cross-section parallel with said substrate extending in said one direction; and moving said substrate on said electrode for supplying high frequency power perpendicularly to said one direction with said substrate being exposed to said plasma.

20. The process of claim 19 wherein said substrate is a magnetic tape or a magnetic disc.

21. A process for treating a surface with a plasma comprising the steps of:

generating a confined linear plasma in a reaction chamber using a raw material gas introduced into said reaction chamber through a continuous slit-like inlet; and moving said surface on an electrode for supplying high frequency power with said plasma being kept perpendicularly to said surface and with said surface being exposed to said plasma, to treat said surface with said plasma uniformly, wherein said slit-like inlet is provided in a sound electrode to form the plasma in the vicinity of said slit-like inlet.

22. The process of claim 21 wherein film formation or etching is conducted on said surface as the treatment with said plasma.

23. The process of claim 21 wherein oxygen is used as said raw material, gas, and ashing is conducted on said surface as the treatment with said plasma.

24. The process of claim 21 wherein said surface is a surface of a magnetic layer, and a diamond-like carbon film is formed on said surface of the magnetic layer by the treatment with said plasma.

25. The process of claim 21 wherein said slit-like inlet is elongated in a direction in which a cross section of the confined linear plasma taken along a plane parallel to said surface extends.

* * * * *